United States Patent
Massonnat et al.

(10) Patent No.: US 11,614,556 B2
(45) Date of Patent: Mar. 28, 2023

(54) METHOD FOR DETERMINATION OF REAL SUBSOIL GEOLOGICAL FORMATION

(71) Applicant: TOTAL SE, Courbevoie (FR)

(72) Inventors: Gérard Massonnat, Pau (FR); Nicolas Gonthier, Pau (FR)

(73) Assignee: Total SE, Courbevoie (FR)

(*) Notice: Subject to any disclaimer, the term of this patent is extended or adjusted under 35 U.S.C. 154(b) by 97 days.

(21) Appl. No.: 17/092,110

(22) Filed: Nov. 6, 2020

(65) Prior Publication Data

US 2021/0141112 A1    May 13, 2021

(30) Foreign Application Priority Data

Nov. 8, 2019 (EP) .................................. 19306449

(51) Int. Cl.
  *G01V 1/30*  (2006.01)
  *G06F 30/20* (2020.01)
  *G01V 3/38*  (2006.01)
(52) U.S. Cl.
  CPC ............... *G01V 1/306* (2013.01); *G01V 3/38* (2013.01); *G06F 30/20* (2020.01); *G01V 2210/644* (2013.01); *G01V 2210/665* (2013.01)
(58) Field of Classification Search
  CPC ....... G01V 2210/661; G01V 2210/665; G01V 3/38; G01V 99/005; G01V 1/306; G01V 2210/644
  See application file for complete search history.

(56) References Cited

U.S. PATENT DOCUMENTS

| | | | | |
|---|---|---|---|---|
| 2008/0126048 A1* | 5/2008 | Labourdette | ......... | G01V 99/005 703/9 |
| 2018/0292208 A1* | 10/2018 | Moore | ............... | G01N 33/1886 |

FOREIGN PATENT DOCUMENTS

| | | |
|---|---|---|
| CN | 107230252 A | 10/2017 |
| WO | 2012/072923 A2 | 6/2012 |

OTHER PUBLICATIONS

Parquer et al., "Conditioning Channel Backward Migration Modeling to Seismic Data", 78th EAGE Conference & Exhibition 2016, Vienna, Austria, 2016.*
Parquer et al., "Recontstruction of Channelized Systems Through a Conditioned Reverse Migration Method", Math Geosci (2017).*
Parquer et al., "Conditioning Channel Backward Migration Modeling to Seismic Data," 78th EAGE Conference & Exhibition, Vienna, Austria, May 30-Jun. 2, 2016, 5 pages.
Patrikalakis et al., *Shape Interrogation for Computer Aided Design and Manufacturing*, "5. Intersection Problems," Springer-Verlag, Jun. 26, 2001, 53 pages.

(Continued)

*Primary Examiner* — Catherine T. Rastovski
(74) *Attorney, Agent, or Firm* — Seed Intellectual Property Law Group LLP

(57) ABSTRACT

The present disclosure relates to a method for determination of a real subsoil geological formation. In at least one embodiment, the method includes receiving a model representing the real subsoil, determining a first fluvial geological formation in said model using parametric surfaces, determining a subsequent fluvial geological formation as a deformation of the first fluvial geological formation using parametric surfaces, and subtracting the first fluvial geological formation from the subsequent fluvial geological formation to create a new geological formation named point bar formation.

7 Claims, 18 Drawing Sheets

(56) References Cited

OTHER PUBLICATIONS

Piegl et al., *The NURBS Book—Monographs in Visual Communication, 2ndEdition*, "Chapter 11—Shape Modification Tools," 1997, 33 pages.
Rossignac et al., "Piecewise-circular curves for geometric modeling," *IBM J. Res. Develop.* 31(3):296-313, May 1987.
Ruiu et al., "Modeling Channel Forms and Related Sedimentary Objects Using a Boundary Representation Based on Non-Uniform Rational B-Splines," *Math Geosci* 48:259-284, 2016.

* cited by examiner

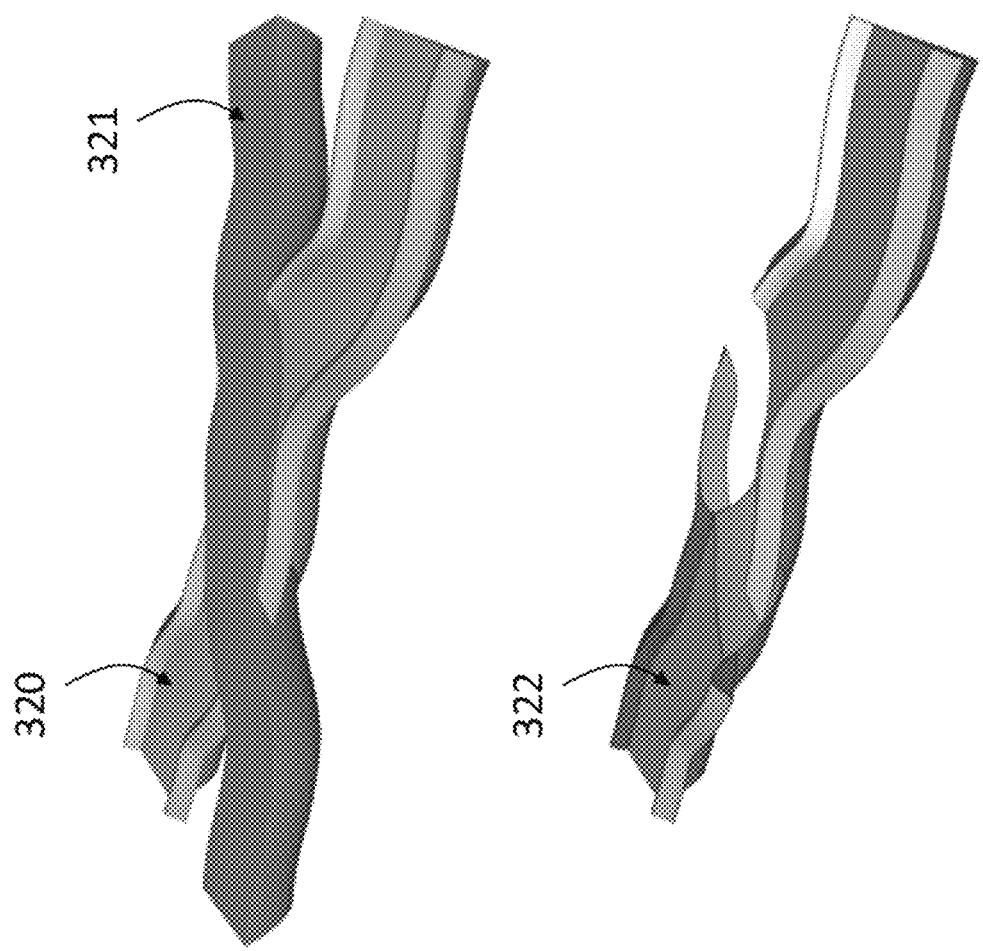

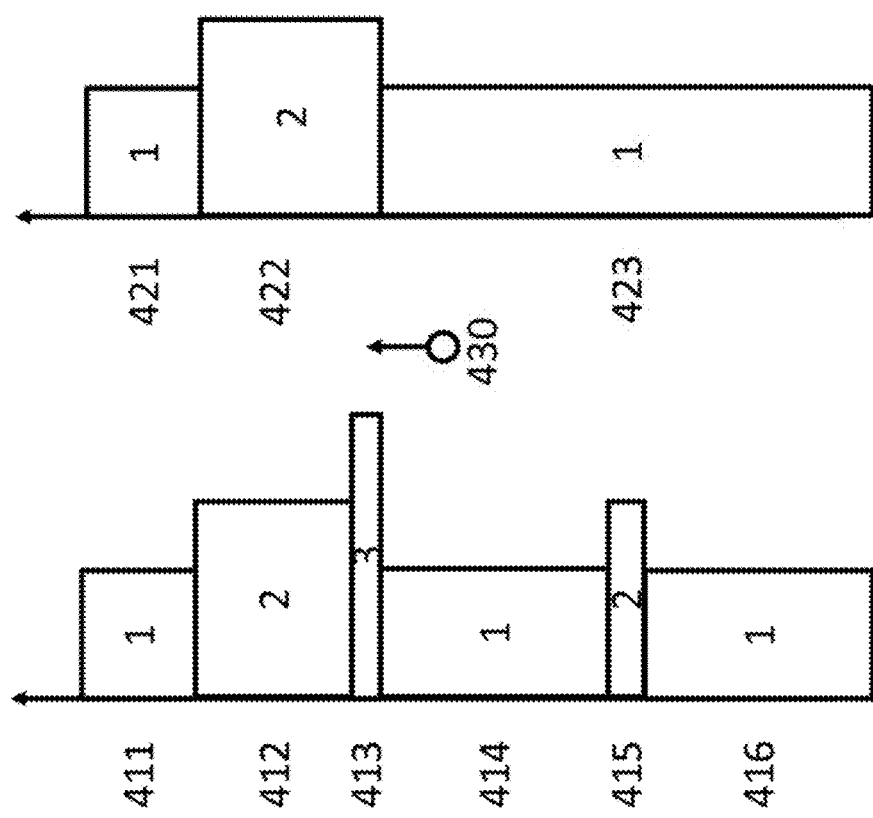

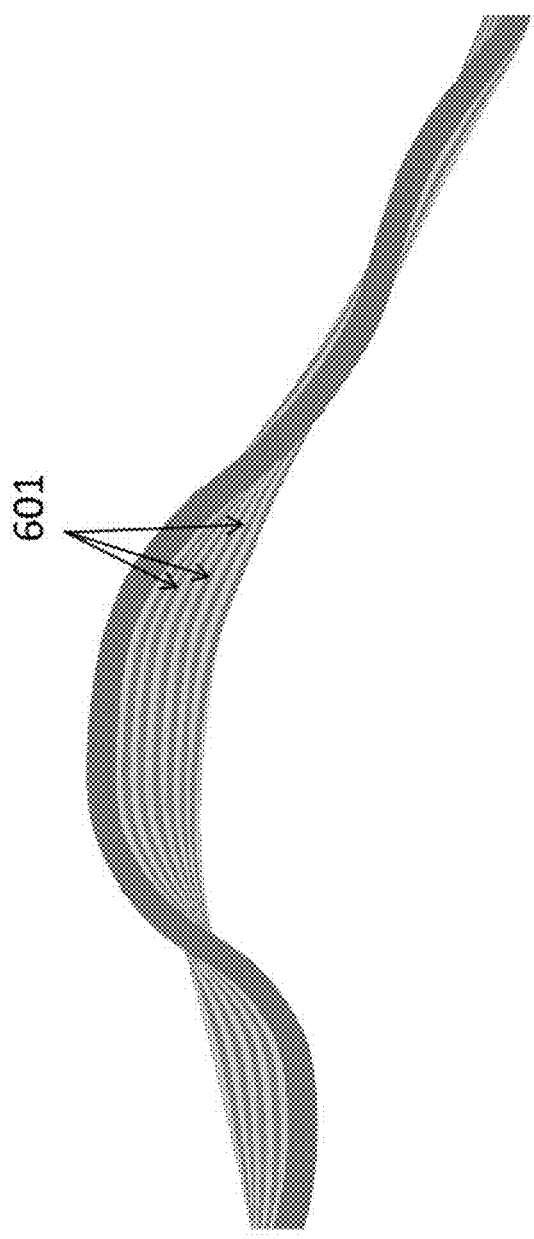
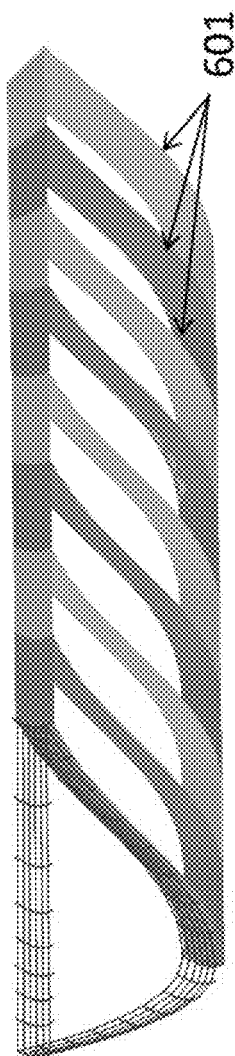

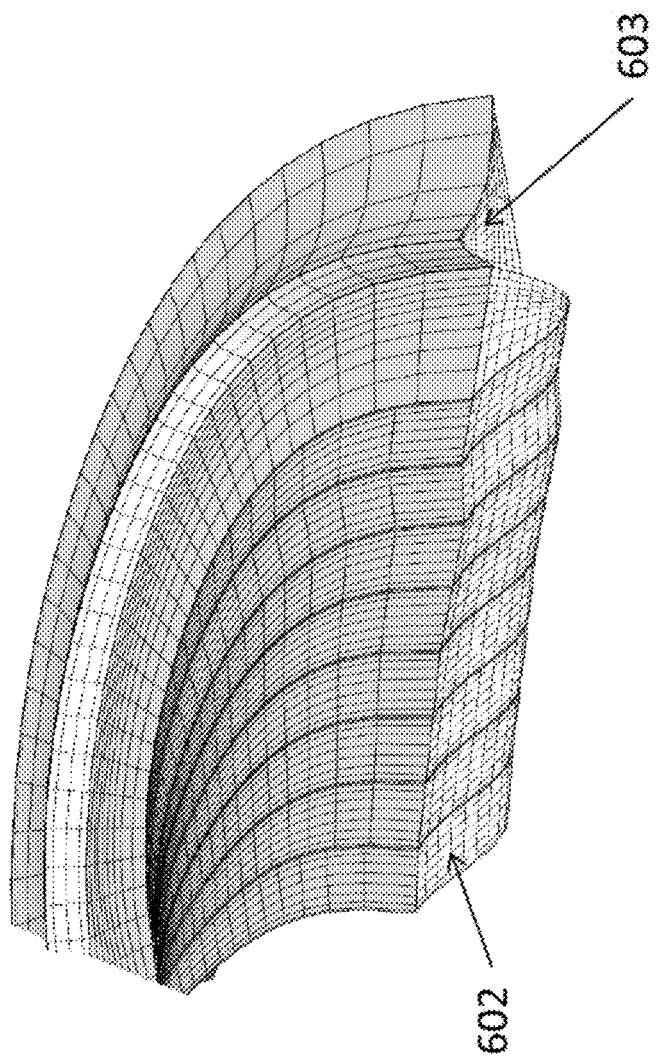

METHOD FOR DETERMINATION OF REAL SUBSOIL GEOLOGICAL FORMATION

BACKGROUND OF THE DISCLOSURE

The present disclosure relates to determination of subsoil formations, especially for the use in the hydrocarbon industries.

The approaches described in this section could be pursued, but are not necessarily approaches that have been previously conceived or pursued. Therefore, unless otherwise indicated herein, the approaches described in this section are not prior art to the claims in this application and are not admitted to be prior art by inclusion in this section. Furthermore, all embodiments are not necessarily intended to solve all or even any of the problems brought forward in this section.

In the past, when a subsoil formation should be determined, a same paradigm is used: "the model used for said determination should be meshed before any modeling".

Indeed, for any modeling methods, the meshing is mandatory.

Nevertheless, it is well known that this meshing prior to any modeling has several drawbacks as the size of the meshes, the orientation of the meshes, and the number of the meshes that induce a bias in the modeling.

For instance, this meshing prior to any modeling cannot take into account the sedimentary bodies/formations of the subsoil which will be identified during the modeling phase.

It is noted that the accurate determination of the subsoil structures/formations is a key feature for determining hydrocarbon reservoirs and enabling a proper industrial production plan/production of hydrocarbons.

In addition, when working with pre-meshed models, it may be difficult to accurately satisfy at the well constraints (i.e. log data) as with the log data where it must be transformed with blocking methods to adapt the precision of the log data to the dimension of the cells.

It is also noted that in the prior art, when geological objects are modeled, the main constraint used is the probability of occurrences of said objects in a given zone. In particular, the specific relation(s) between the object of the zones are not taken into account (for instance, some objects may only exist in connection to/close to/downstream to other specific object(s)).

Furthermore, in prior art methods, it may be difficult to associate the cells with facies or geophysical property as the dimension of the cell does not allow a proper identification of their respective position in the geological formations.

SUMMARY OF THE DISCLOSURE

The disclosure relates to a method for determination of real subsoil formation characterized in that the method comprises:
/a/ receiving a model representing the real subsoil, said model comprising a stratigraphic layer, said stratigraphic layer comprising a shore line dividing the stratigraphic layer into a continental zone and a marine zone;
/b/ receiving a first flow speed field for the stratigraphic layer;
/c/ receiving a second flow speed field representative of a sea for the stratigraphic layer;
/d/ determining a weighted combination, named global flow speed field, of the first flow speed field and the second flow speed field for each position in the stratigraphic layer, weights of the combination are based on a distance of said position to the shore line and the fact that the position is within the continental zone or the marine zone
/e/ determining a real subsoil geological formation for the stratigraphic layer based on the determined global flow speed field.

The received second flow speed field may be determined based on hydrodynamic modeling.

The received second flow speed field may be determined based on the shore line.

Before the computation of the global flow speed field, the first flow speed may be modified to align a gradient of the first flow speed field with the shore line.

The model may comprise a plurality of stratigraphic layers, each stratigraphic layer within said plurality may comprise a respective shore line dividing the stratigraphic layer into a respective continental zone and a respective marine zone.

Steps /b/ to /e/ may be reiterated for each stratigraphic layer within said plurality.

The respective shore line for each stratigraphic layer within said plurality may be different from the respective shore line for the other stratigraphic layer within said plurality.

An intersection between the transitional zone and the continental zone may be void or may be the shore line.

The disclosure is also directed to a device for determination of real subsoil geological formation characterized in that the device comprises:
/a/ an interface for receiving a model representing the real subsoil, said model comprising a stratigraphic layer, said stratigraphic layer comprising a shore line (800) dividing the stratigraphic layer into a continental zone (801) and a marine zone (802);
/b/ an interface for receiving a first flow speed field (811) for the stratigraphic layer;
/c/ an interface for receiving a second flow speed field (812) representative of a sea for the stratigraphic layer;
/d/ a circuit for determining a weighted combination, named global flow speed field, of the first flow speed field and the second flow speed field for each position in the stratigraphic layer, weights of the combination are based on a distance of said position to the shore line (800) and the fact that the position is within the continental zone or the marine zone
/e/ a circuit for determining the real subsoil composition for the stratigraphic layer based on the determined global flow speed field.

The disclosure is also directed to a non-transitory computer readable storage medium, having stored thereon a computer program comprising program instructions, the computer program being loadable into a data-processing unit and adapted to cause the data-processing unit to carry out the steps of the method described above when the computer program is run by the data-processing device.

The disclosure is also directed to a method for determination of real subsoil geological formation characterized in that the method comprises:
/a/ receiving a model representing the real subsoil,
/b/ determining a first fluvial geological formation in said model using parametric surfaces,
/c/ determining a subsequent fluvial geological formation as a deformation of the first fluvial geological formation using parametric surfaces, /d/ subtract the first fluvial geological formation from the subsequent fluvial geological formation to create a new geological formation named point bar formation.

The determining of a first fluvial geological formation may be performed based on a stochastic process.

The deformation of step /c/ may comprise:
determining inflection points of a trajectory of the first fluvial formation, said trajectory being in the parametric surface of the first fluvial formation;
modifying the trajectory of the first fluvial formation to create a trajectory of the subsequent fluvial formation, said trajectory of the subsequent fluvial formation passing through the inflection points;
defining parametric surface of the subsequent fluvial formation based on the trajectory of the subsequent fluvial formation.

Steps /c/ to /d/ may be reiterated to create a plurality of point bar formations.

A respective flow transmissivity parameter may be associated with each one of the plurality of point bar formations, the respective flow transmissivity parameter for a given point bar formation determined during the iteration n being greater than the respective flow transmissivity parameter for a given point bar formation determined during the iteration n+1.

Therefore; it is possible to compute a fluid flow simulation based on said transmissivity parameter.

The disclosure is also directed to a device for determination of real subsoil geological formation characterized in that the device comprises:
/a/ an interface for receiving a model representing the real subsoil,
/b/ a circuit for determining a first fluvial geological formation in said model using parametric surfaces,
/c/ a circuit for determining a subsequent fluvial geological formation as a deformation of the first fluvial geological formation using parametric surfaces,
/d/ a circuit for subtract the first fluvial geological formation from the subsequent fluvial geological formation to create a new geological formation named point bar formation.
/e/ a circuit for determine a real subsoil composition for the point bar formation.

The disclosure is also directed to a non-transitory computer readable storage medium, having stored thereon a computer program comprising program instructions, the computer program being loadable into a data-processing unit and adapted to cause the data-processing unit to carry out the steps of the method described above when the computer program is run by the data-processing device.

The disclosure is also directed to a method for determination of real subsoil geological formation characterized in that the method comprises:
/a/ receiving a model representing the real subsoil,
/b/ determine a first stochastic trajectory of a first fluvial formation in said model,
/c/ defining a constraint zone comprising said first fluvial formation,
/d/ determining a second stochastic trajectory of a second fluvial formation in said model within said constraint zone based on a stochastic process.

Edges of the constraint zone may be within a predetermined distance to the first stochastic trajectory of a first fluvial formation.

Step /d/ may be reiterated a predetermined number of time.

Steps /c/ to step /d/ may be reiterated, in said reiteration, the second fluvial formation may be taken as the first fluvial formation and a third stochastic trajectory of a third fluvial formation may be taken as a second stochastic trajectory of a second fluvial formation.

Step /d/ may comprise a displacement of the constraint zone according to a given direction between iterations Determining the second stochastic trajectory may comprise:
/d1/ determining a point of the model based on the stochastic process,
/d2/ if said point is outside the constraint zone, reiterating steps /d1/ and /d2/, otherwise, adding said point to the second stochastic trajectory
wherein if the reiteration of steps /d1/ and /d2/ exceeds a predetermined number, the determining of second stochastic trajectory is reinitialized.

Determining the second stochastic trajectory may comprise:
/d1/ determining a point of the second stochastic trajectory,
/d2/ if said point is outside the constraint zone, changing coordinates of said point to a closest point of the constraint zone.

Determining the second stochastic trajectory may comprise:
/d1/ determining a point of the second stochastic trajectory,
/d2/ if said point is outside the constraint zone, reiterating steps /d1/ and /d2/
wherein if the reiteration of steps /d1/ and /d2/ exceeds a predetermined number, coordinates of said point is changed to a closest point of the constraint zone.

The disclosure is also directed to a device for determination of real subsoil geological formation characterized in that the device comprises:
/a/ an interface for receiving a model representing the real subsoil,
/b/ a circuit for determining a first stochastic trajectory of a first fluvial formation in said model,
/c/ a circuit for defining a constraint zone comprising said first fluvial formation,
/d/ a circuit for determining a second stochastic trajectory of a second fluvial formation in said model within said constraint zone based on a stochastic process.

The disclosure is also directed to a non-transitory computer readable storage medium, having stored thereon a computer program comprising program instructions, the computer program being loadable into a data-processing unit and adapted to cause the data-processing unit to carry out the steps of the method described above when the computer program is run by the data-processing device.

The disclosure is also directed to a method for determination of real subsoil geological formation characterized in that the method comprises:
/a/ receiving a model representing the real subsoil, said model comprising a shore line (1000) and a fluvial formation (1003) connected to said shore line at a point (1006) of the model, said shore line dividing the model into a marine zone and a continental zone,
/b/ determining a delta zone in the model based on the shore line and based on the fluvial formation,
/c/ determining a stochastic trajectory in said delta zone,
/d/ determining a lobe formation in said delta zone based on the determined stochastic trajectory based on a stochastic process.

The determined delta zone may be parametrized by a delta angle and a delta length.

The delta angle and the delta length may be determined based on a flow speed in the fluvial formation.

The delta angle and the delta length may be determined based on a flow speed in the marine zone.

It is also possible to determine a tidal bar formation along the stochastic trajectory.

The disclosure is also directed to a device for determination of real subsoil geological formation characterized in that the device comprises:
- /a/ an interface for receiving a model representing the real subsoil, said model comprising a shore line (1000) and a fluvial formation (1003) connected to said shore line at a point (1006) of the model, said shore line dividing the model into a marine zone and a continental zone,
- /b/ a circuit for determining a delta zone in the model based on the shore line and based on the fluvial formation,
- /c/ a circuit for determining a stochastic trajectory in said delta zone,
- /d/ a circuit for determining a lobe formation in said delta zone based on the determined stochastic trajectory based on a stochastic process.

The disclosure is also directed to a non-transitory computer readable storage medium, having stored thereon a computer program comprising program instructions, the computer program being loadable into a data-processing unit and adapted to cause the data-processing unit to carry out the steps of the method described above when the computer program is run by the data-processing device.

The disclosure is also directed to a method for determination of real subsoil geological formation characterized in that the method comprises:
- /a/ receiving a model representing the real subsoil,
- /b/ receiving a proportions cube describing geological properties of the model;
- /c/ determining a permeability value for a plurality of locations of the model based on the received proportions cube;
- /d/ determining a gradient of the flow speed based on the permeability value determined for a plurality of locations of the model;
- /e/ determining a fluvial formation based on the gradient of the flow speed.

Based on the proportions cube, it is possible to determine a pseudo-permeability value but to use it as a permeability value to solve the fluid flow equations. Therefore, this is the reason that it is correct to determine a "permeability value" based on the "pseudo-permeability value".

The determination of the gradient may comprise a solving of a Darcy-Weisbach equation.

The proportions cube may be a facies proportions cube,

The determination of the pseudo-permeability value may comprise a mean of respective permeability value of facies weighted by the proportion of said facies according to the facies proportions cube.

Step /d/ comprises interpolation of the pseudo-permeability value for locations of the model where no proportions cube is available.

The model may comprise a no-flow zone,

The pseudo-permeability value for location in said no-flow zone may be set to 0.

The disclosure is also directed to a device for determination of real subsoil geological formation characterized in that the device comprises:
- /a/ an interface for receiving a model representing the real subsoil,
- /b/ an interface for receiving a proportions cube describing geological properties of the model;
- /c/ a circuit for determining a pseudo-permeability value for a plurality of locations of the model based on the received proportions cube;
- /d/ a circuit for determining a gradient of the flow speed based on the pseudo-permeability value determined for a plurality of locations of the model;
- /e/ a circuit for determining a fluvial formation based on the gradient of the flow speed.

The disclosure is also directed to a non-transitory computer readable storage medium, having stored thereon a computer program comprising program instructions, the computer program being loadable into a data-processing unit and adapted to cause the data-processing unit to carry out the steps of the method described above when the computer program is run by the data-processing device.

Other features and advantages of the method and apparatus disclosed herein will become apparent from the following description of non-limiting embodiments, with reference to the appended drawings.

BRIEF DESCRIPTION OF THE DRAWINGS

The present disclosure is illustrated by way of example, and not by way of limitations, in the figures of the accompanying drawings, in which like reference numerals refer to similar elements and in which:

FIGS. 3b and 3c are 3D view of interconnected fluvial geological formations;

FIG. 4b is a representation of well data and provides indication on distortion of a geological formation to satisfy a well constraint (vertical distortion);

FIGS. 6a and 6b are respectively a top view of associated geological formations and 3D view of said associated geological formations;

FIG. 6c provides examples regarding the meshing of associated geological formations;

DETAILED DESCRIPTION

In the following description, fluvial geological formations are described exemplifying the disclosure but it applies to any possible geological formations (e.g. lobes, turbiditic systems, etc.)

Therefore, in the following, "fluvial trajectory" may be replaced by "sediment trajectory" or "flow trajectory" without significant modification.

Figure 1:
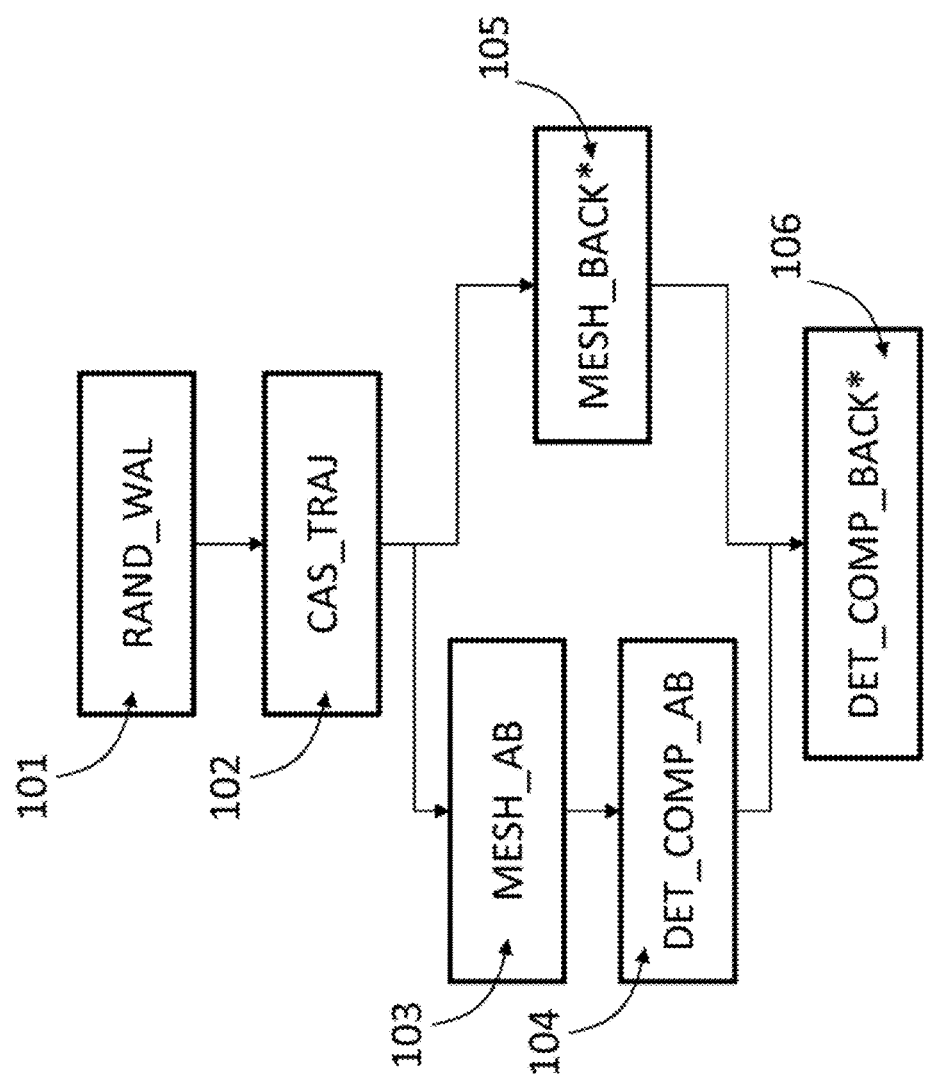
FIG. 1 is a general workflow of a possible embodiment of the disclosure.

FIG. 1 is a chart describing a possible process of the disclosure.

In this chart, the manipulated model is possibly a parametric model of the subsoil. A parametric model $M_p(u,v,t)$ of the subsoil is a transformation of a 3D model $M(x,y,z)$ of the subsoil.

A 3D model $M(x,y,z)$ of a real subsoil describes the subsoil according to its real geographical coordinates $(x,y,z)$ (i.e. at the present time).

A parametric model $M_p(u,v,t)$ of said subsoil describes the state of the subsoil at a geological time t: each layer represents the state of the subsoil at the time t where the sedimentation occurs. One may say that the parametric model $M_p(u,v,t)$ restores the horizontal layer for a given sedimentation/geological time t.

In the manipulated model, it is possible to simulate the geological formation of a fluvial zone. Said geological formation determination of a fluvial zone may comprise, as described in WO 2012/072923, the displacement of particles (step 101 "RAND_WAL") in the manipulated model by superimposing:
 a deterministic term defined on the basis of observation data for the fluvial zone to be determined, and
 a stochastic term parametrized at least by the observation data.

It is possible to take into account both the sedimentary flow in the zone, and to introduce a probabilistic perturbation.

When one speaks of superposition of two terms, it will be understood that the simulated displacement is composed from the sum of the deterministic term and of the stochastic term.

The stochastic term can comprise the superposition of a meandriform term and of a random perturbation. So doing, the modeling of the channel is rendered more realistic.

The meandriform term can comprise a superposition of at least one trigonometric function. Such a representation is realistic for a meandriform term, and easily parameterizable.

The observation data can comprise at least one of the following types of data:
 a gradient of flow speed in the zone,
 geometric parameters of the zone,
 data arising from drilling,
 data arising from imaging, especially seismic imaging.

It is noted that the model does not need to be meshed up to this point. A parametric description of the trajectory may be easily determined in the model.

Once the respective trajectory 201 (see FIGS. 2a, 2b) of geological formation(s) of a fluvial zone is/are determined (for the sake of the understanding, the singular is used in the following, considering that only one trajectory 201 is determined, but it is apparent that the plural may also be used), it is possible to determine surface(s) (step 102 "CAS_TRAJ") that represent the extend of the determined geological formation, the trajectory being inside said extends. This extends may represent the bed of a river/torrent/etc. or any geological formation of the fluvial zone (see element 202, FIGS. 2a, 2b).

To describe these surfaces, it is possible to use NURBS (or Non-Uniform Rational B-Splines). Alternatively, in the followings, the use of NURBS surfaces/lines may be any parametric surfaces/lines.

NURBS is a mathematical model used in computer graphics for generating and representing curves and surfaces. It offers great flexibility and precision for handling both analytic (surfaces defined by common mathematical formulae) and modeled shapes.

Therefore there is no need to identify the bed of said formations by identifying the meshes/cells of the meshed model that are inside the bed: a parametric description of said formations enables a far better meshing performed at a later stage fitting the NURBS surfaces.

Figure 3A:
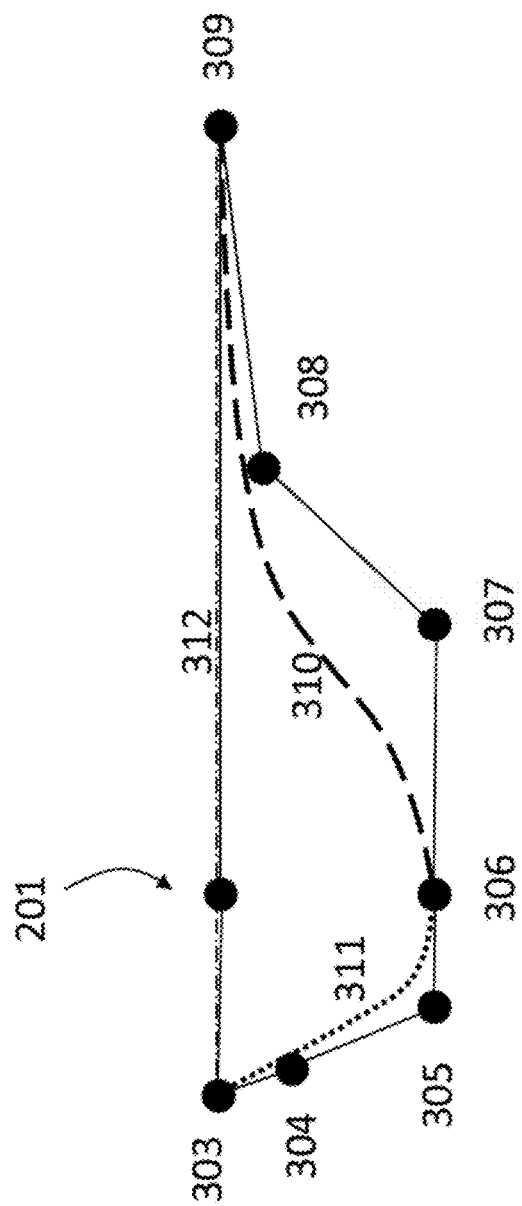
FIG. 3a is a representation of surfaces/sides determination of a fluvial geological formation with NURBS surfaces.

For instance, in FIG. 3a, a side view of the model is shown, the trajectory 201 being perpendicular to said view. In said figure, trajectory 201 is represented as a single point. When referring to "point 201", one means the point corresponding to the intersection between the view plan of figure and the trajectory 201.

To represent the extend of the determined geological formation, it is possible to represent the shape of bed by a plurality of NURBS 310, 311 and 312, ensuring that the contacts of these NURBS satisfy some parametric continuity (for instance $C^0$, $C^1$ and/or $C^2$) and/or some geometric continuity (for instance $G^0$, $G^1$ and/or $G^2$).

Figure 2A:
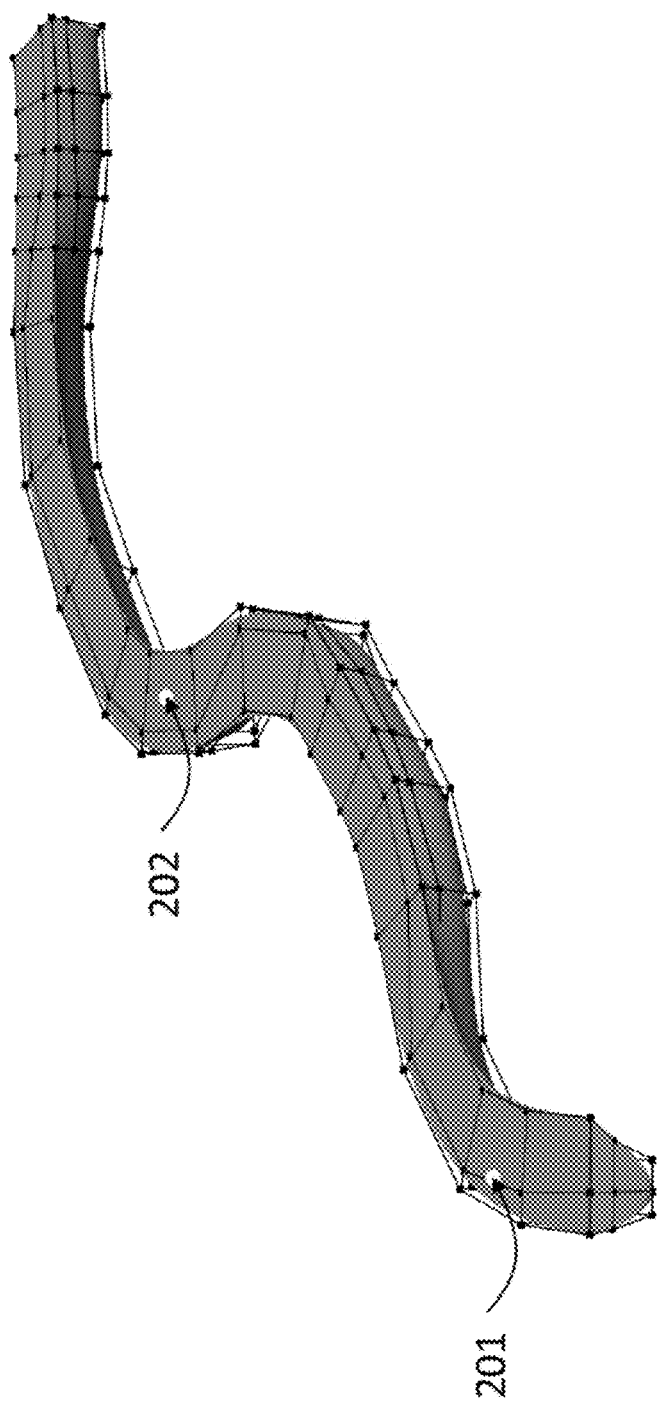
FIGS. 2a and 2b are respectively a 3D view of a fluvial geological formation and a top view of a fluvial geological formation.
Figure 2B:
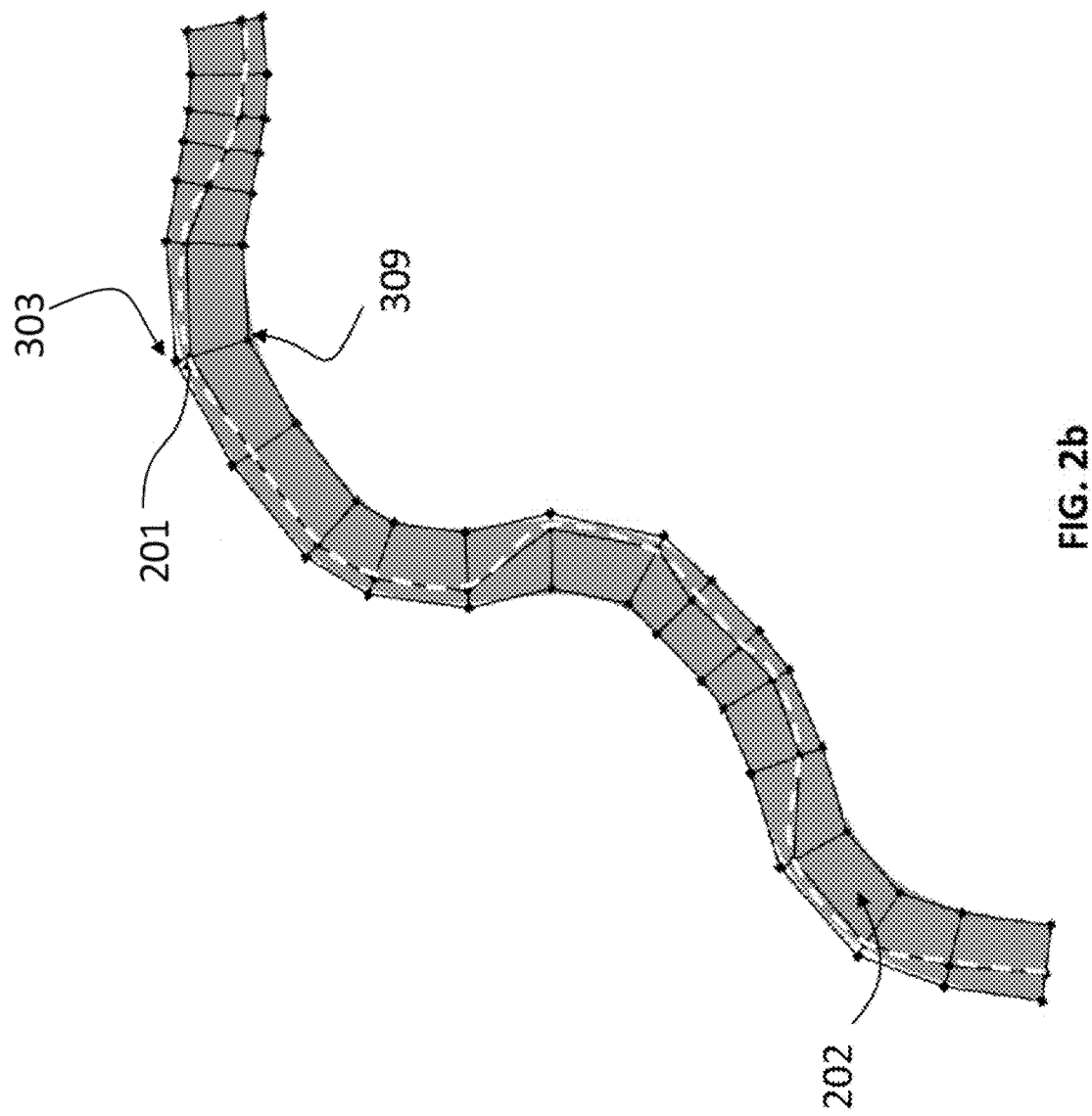

In the example of FIG. 3a, point 303 and 309 may be defined such that 303, 201 and 309 are aligned, the respective distance between 303-201 and 201-309 may be function of the local curvature of the trajectory 201 (see FIG. 2b).

In said example, point 303 represents a point on the convex side of the curvature of the trajectory 201; point 309 represents a point on the concave side of the curvature of the trajectory 201. Thus, it is possible to compute the distances 303-201 and 201-309 as a function of the local curvature of the trajectory 201 and such that the distance 303-201 is lower than distance 309-201.

Point 306 may be determined such that the line (306;201) is perpendicular to the line (303;309) and such that the distance 306-201 is either a predetermined value or function of the local curvature or function of the distance 303-309.

In addition, once the positions of points 306, 303 and 309 are determined, it is possible to determine a plurality of set of points 304, 305, 307 and 308. These points may have a location function of the positions of points 306, 303 and 309 and/or the curvature of trajectory 201.

Points 303, 304, 305, 306 may define a first NURBS 311.
Points 309, 308, 307, 306 may define a second NURBS 310.

A third NURBS 312 may be defined to close the shape of the bed.

NURBS curves may be determined thanks to the Cox-de Boor's Algorithm.

This process is described in regard of a side view of the trajectory (perpendicular to said trajectory) but can be reiterated for a plurality of different side views of the trajectory (see FIG. 2b for instance). Then, NURBS surfaces may be defined thanks to the NURBS curves (or thanks to points that have been used to define the NURBS curves).

The use of the NURBS surfaces is very effective as it is possible to "subtract" volumes of determined geological formations. For instance, referring to FIG. 3b, if two geological formations 320 and 321 are determined and if their respective volumes intersect each other, available NURBS Intersection algorithms (see for instance Patrikalakis, N. M., & Maekawa, T. (2010). Intersection problems. In Shape Interrogation for Computer Aided Design and Manufacturing (pp. 109-160). Springer, Berlin, Heidelberg or Rossignac, J. R., & Requicha, A. A. (1987). Piecewise-circular curves for geometric modeling. *IBM Journal of Research and Development*, 31 (3), 296-313) provide accurate and effective method to subtract the volume of formation 321 to formation 320 (representing the replacement of the formation 320 by formation 321 due to hydrodynamic/fluvial erosion) to create the new volume 322 (FIG. 3c). Algorithms based on cells/meshes (i.e. identifying cells that are in both formations) are not as accurate and effective as the NURBS algorithms.

Figure 4A:
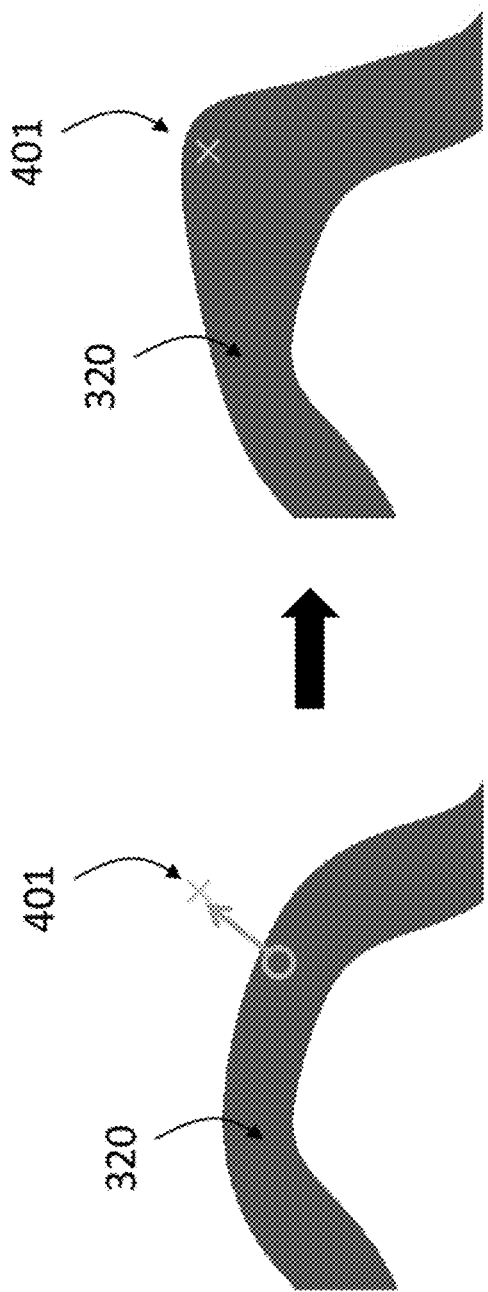
FIG. 4a is a top view of a distortion of a representation of a geological formation to satisfy a well constraint (horizontal distortion)

In addition, if the model has some constraints (e.g. a seismic or geological indication that a formation is present at a given location), it is possible to distort the closest NURBS 320 to ensure that this constraint 401 (see FIG. 4a, which is a top view of the model) is satisfied. The distortion methods for NURBS surfaces are well available (for instance, Piegl, L., & Tiller, W. (2012). The NURBS book. Springer Science & Business Media, chapter 11). Therefore it is possible to satisfy all constraints of the model.

It is also possible to distort the formation vertically to match the constraints but within a given distance/zone. For instance, if one may want to satisfy the well-data (see FIG. 4b) represented by layers 411-416, it is possible to use the logs directly without applying a blocking method (which was mandatory in the method of the prior art, i.e. the reduction to coarser layers 421-423). Thanks to said method, if it is known that a fluvial formation is in the layer 413 and that the closest formation in the model is at position 430, it is easy to distort the NURBS to satisfy the constraints. With a blocking method, this constraint may not be satisfied as the layer 413 may disappear.

Once the formations are determined thanks to the NURBS surfaces, it is possible to mesh the formations (step 103 "MESH_AB" of FIG. 1) according to the formations surfaces definition.

Figure 5:
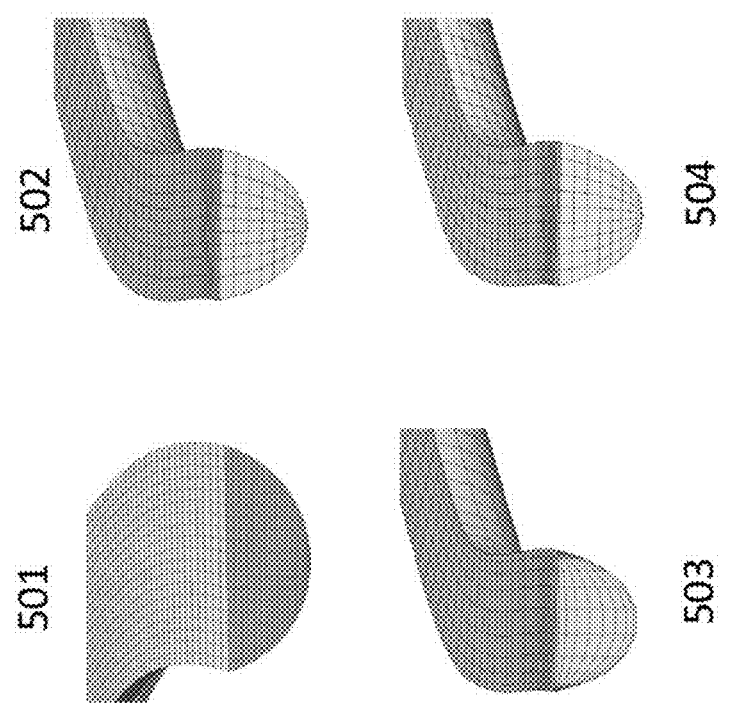
FIG. 5 provides examples regarding the meshing of geological formations.

A plurality of meshing is possible as described in FIG. 5. For instance, meshes 501, 502, 503 or 504 are possible. Well-known methods such as the Quadtree meshing method, the Octree meshing method, Front method, Delaunay method, Prograding grid, divergent grid, aggrading grid, etc. are usable.

It is possible to understand that the meshing performed a posteriori (i.e. after the determination of the formation shapes) is far better (i.e. fits the shape of the geological bodies) than a meshing performed a priori (i.e. before any shape determination of geological formation).

In addition, based on the first geological formations determined, it is possible to create related formations such as lobes (i.e. at an end of the fluvial formation), bar, point bar (see FIGS. 6a and 6b, the number of internal surfaces 601 or the distance between surfaces 601 may be set by the user), or crevasse splays or levees (fluviatile or turbiditic). Each of these associated/related formations may have their own rules regarding the meshing of these formations (for instance, in FIG. 6c, the size/shape/meshing of the cells in point bar zones 602 may be different than the size/shape/meshing in the levee zone 603).

Thanks to this method, it is possible to adequately mesh the model according to the needs and to the specific shape of the formations. If a meshing was performed prior to any formation determination, it is apparent that this meshing cannot fit the need of the modeling.

In addition, the shape of other geological formations may be determined based on a distance to a previously determined formation or/and to a probability of existence of a surface of said other geological formations (function, for instance, of a distance (e.g. radial or lateral) to previously determined formations).

Figure 7A:
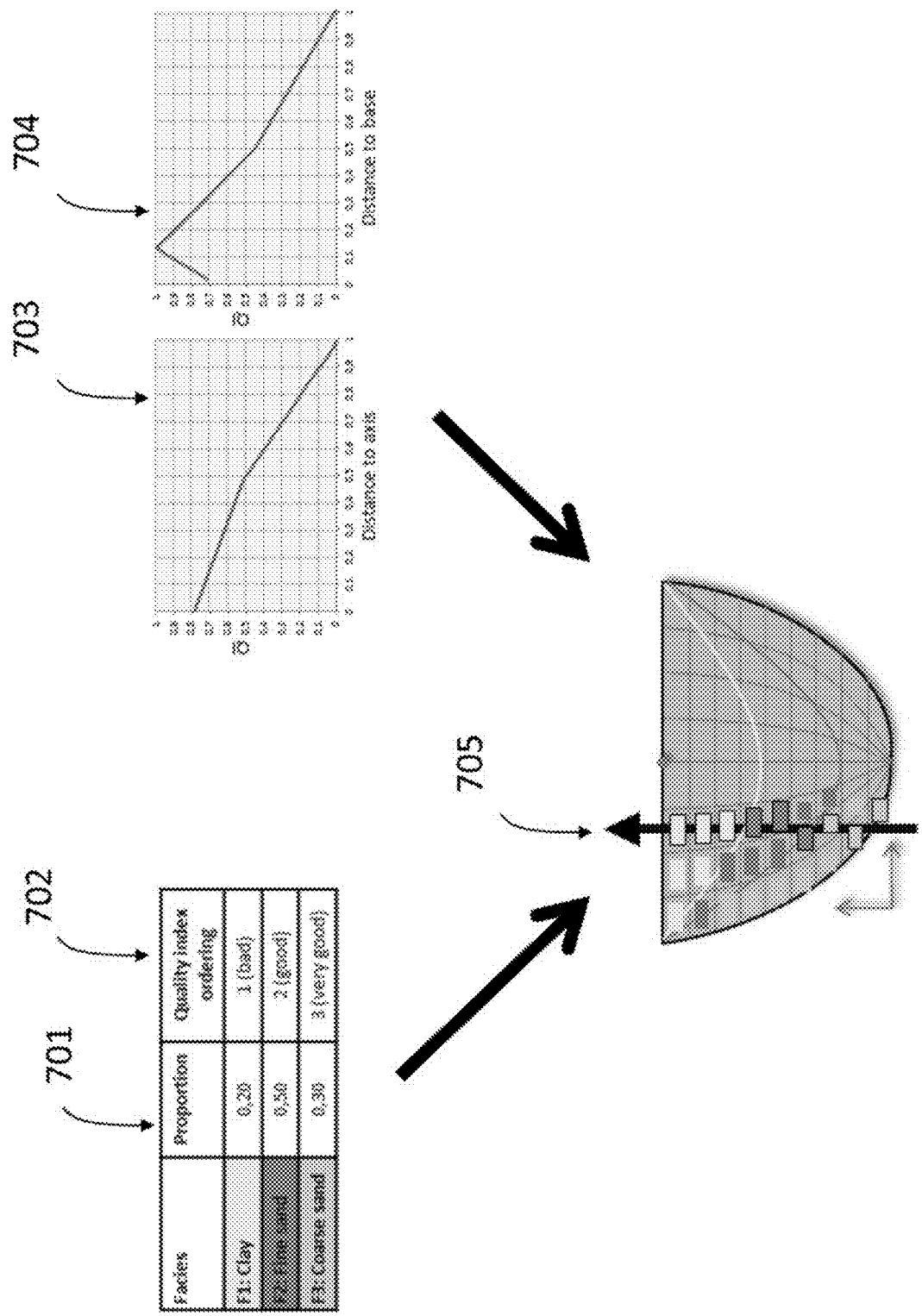
FIG. 7a exemplifies a possible process for associating a facies to a cell of a geological formation.

It is also possible to associate a facies (step 104 "DET_COMP_AB" of FIG. 1) to each cell of the newly created mesh (i.e. for each geological formation) as shown in FIG. 7a.

This association may be based on:
quality index distributions $QI_i(p)$ for each driver i function of the considered (absolute or relative) position p (elements 703 and 704 being respectively the facies quality index distribution function of the distance to the vertical axis 201-306 of the shape of the bed and the facies quality index distribution function of the distance to the base 306 of the bed),
facies proportions (column 701);
or on facies quality index ordering (column 702).

In this example of FIG. 7a, the quality index distributions are function of the distance to the vertical axis 201-306 of the shape of the bed and of the distance to the base 306 of the bed, but other geological formations may have quality index distributions function of other parameters set by the operator (i.e. the person setting the modeling).

For each cell of the geological formation that is considered, said cell having a position p, a cell quality index $QI_{cell}$ is computed as being $QI_{cell} = \Sigma_i QI_i(p)/N$ (i being the current driver, N being the total number of drivers).

Then, the following process (see 705) may be used for associating a facies to a cell in a formation (having a plurality of cells):
/a/ selecting a cell with the lowest $QI_{cell}$ within the cells in the plurality of cells having no facies associated to;
/b/ associating, to said cell, the facies with the lowest Quality index ordering (column 702) within the facies for which the proportion is not reached (column 701)
/c/ reiterating step /a/ to /c/ until all cells in the plurality of cells are associated with a facies.

It is apparent that the "lowest" words may be replaced by the "biggest" in said process.

It is also possible to associate a geological property (e.g. permeability, porosity, etc.) (step 104 "DET_COMP_AB" of FIG. 1) to each cell of the newly created mesh (i.e. for each geological formation) as shown in FIG. 7b.

This association may be based on property quality index distributions $QI_i(p)$ for each driver i function of the considered (absolute or relative) position p (elements 713 and 714 being respectively the property quality index distribution function of the distance to the vertical axis 201-306 of the shape of the bed and the property quality index distribution function of the distance to the base 306 of the bed) and on property distribution (curve 711).

Figure 7B:
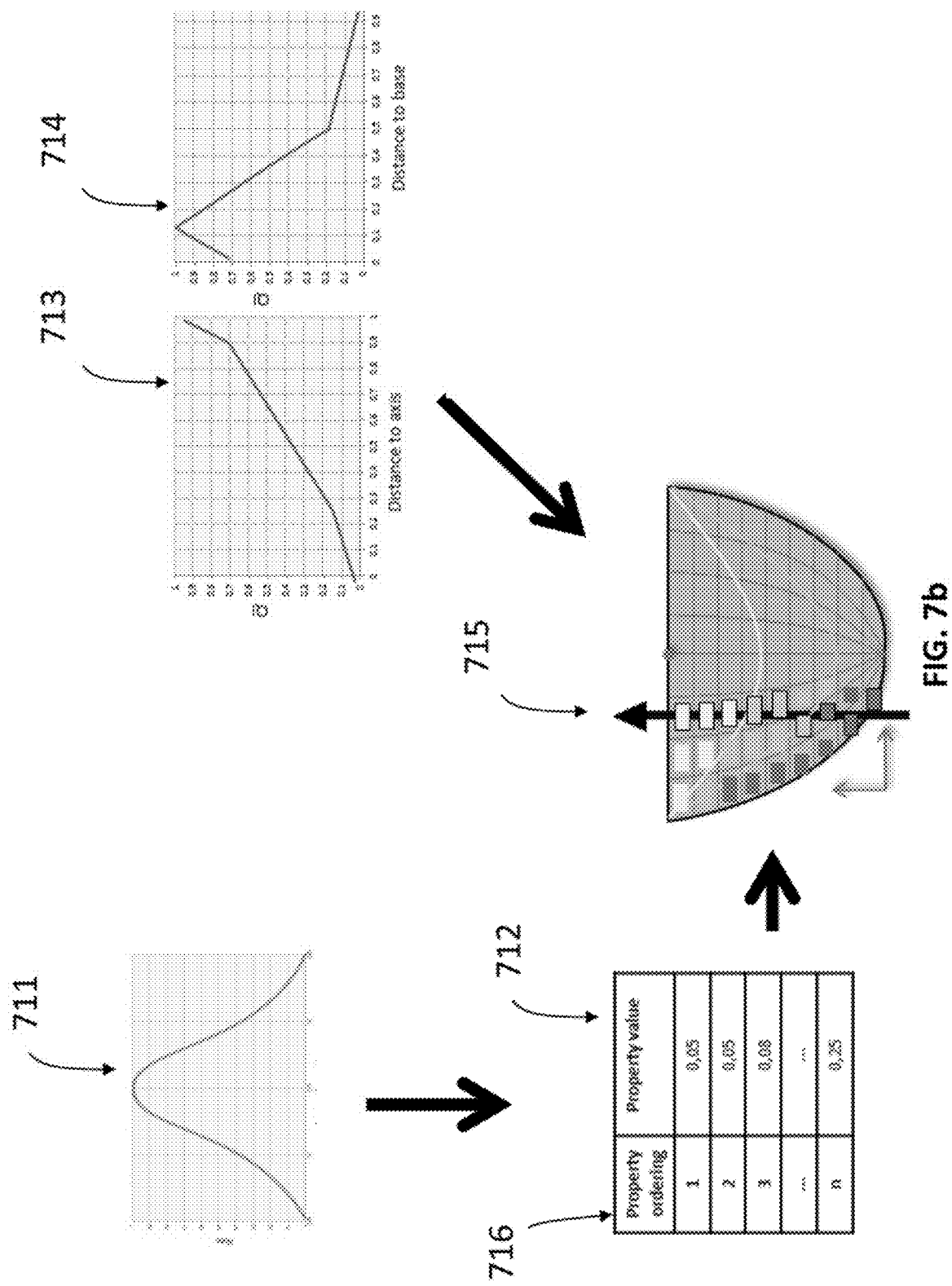
FIG. 7b exemplifies a possible process for associating a property to a cell of a geological formation.

In this example of FIG. 7b, the property quality index distributions are function of the distance to the vertical axis 201-306 of the shape of the bed and of the distance to the base 306 of the bed, but other geological formations may have property quality index distributions function of other parameters set by the operator (i.e. the person setting the modeling).

For each cell of the geological formation that is considered, said cell having a position p, a cell quality index $QI_{cell}$ is computed as being $$QI_{cell} = \frac{\sum_i QI_i(p)}{N}$$

(i being the current driver, N being the total number of drivers).

Then, the following process (see 715) may be used for associating a property to a cell in a formation (having a plurality of cells):

/a/ determining M random draw of property values in the property distribution 711 (M being the number of cells in the plurality of cells) and ordering said M random draw from the lowest to the greatest value (see 712) (the index/rank/order of the random draw for this ordering is the "property ordering"));

/b/ selecting a cell with the lowest $QI_{cell}$ within the cells in the plurality of cells having no property associated to;

/c/ associating, to said cell, the random draw (property) with the lowest property ordering (column 716) within the random draws that have not been associated yet with a cell (column 712)

/d/ reiterating steps /a/ to /d/ until all cells in the plurality of cells are associated with a property.

It is apparent that the "lowest" (respectively "biggest") words may be replaced by the "biggest" (respectively "lowest") in said process.

For part(s) of the model that is/are not determined geological formations (i.e. background zone), it is possible to mesh (step 105 "MESH_BACK" of FIG. 1) it/them with common method(s) and to associate its/their cells with property/facies (step 106 "DET_COMP_BACK" of FIG. 1) according to the relative position of the cells in regard of the geological formation determined (e.g. facies probabilities may be set by the operator according to a radial/lateral distance of a determined geological formation).

Figure 8:
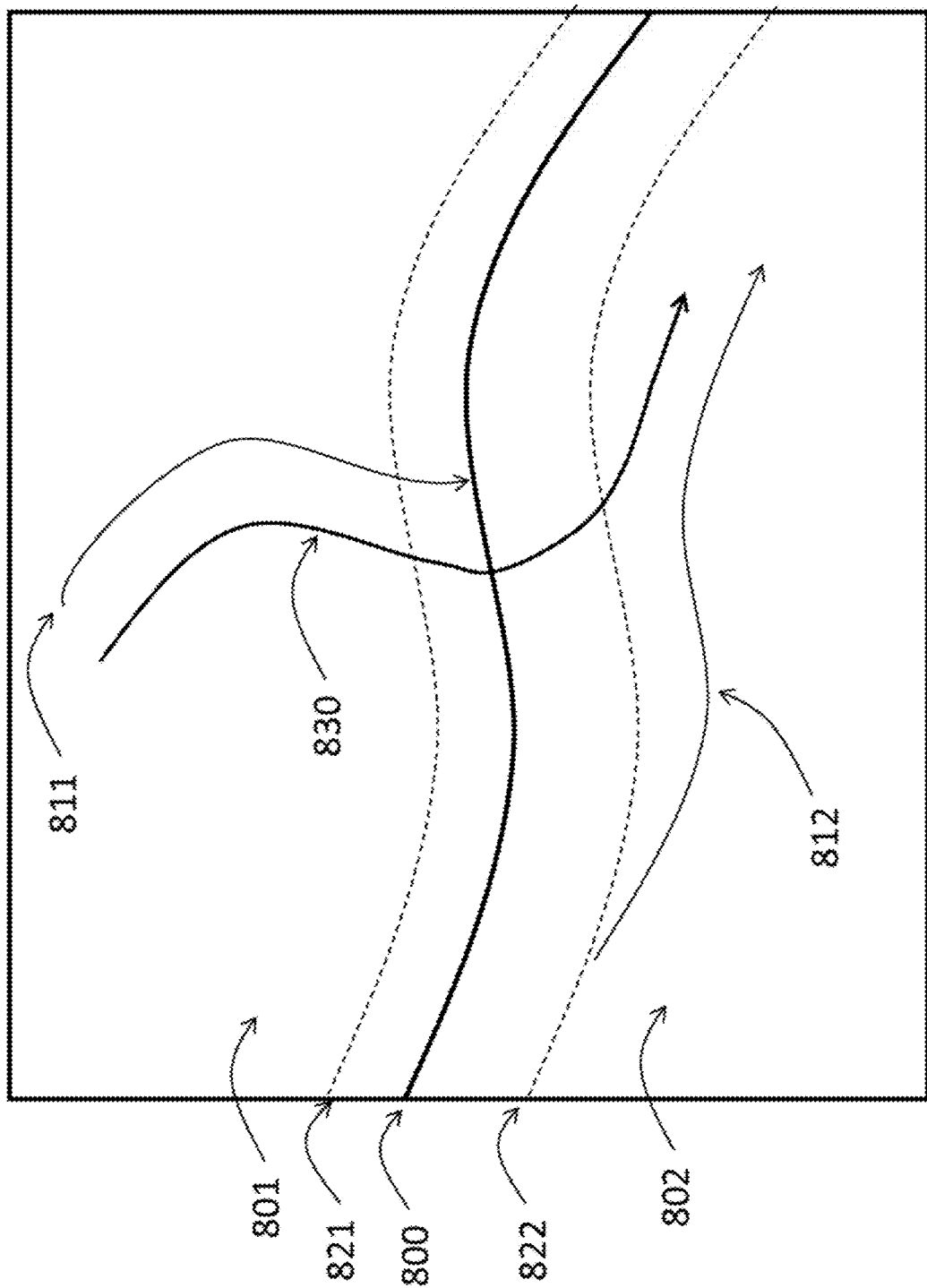
FIG. 8 is a possible embodiment for dynamically determining flow speed field in the model/in the zone.

FIG. 8 is a possible embodiment for dynamically determining flow speed field in the model/in the zone (the "flow speed field" may represents the speed of a particle or water in said field).

Indeed, it is apparent that the determination of the fluvial trajectory or the determination of any trajectory in the model may be based on the flow speed or on the gradient of the flow speed.

Then, it may be advantageous to ease the determination of a realistic flow speed field in the model.

The model (which could be a parametric model (u,v,t)) comprises at least one stratigraphic layer (i.e. for a given t). In the representation of FIG. 8, only one stratigraphic layer is shown. A shore line 800 splits the stratigraphic layer into two zones.

In continental zones (801) of the model, the flow speed (811) may be determined based on geological constraints (e.g. valleys, mountains, etc.). Nevertheless, in marine zones (802), said considerations are not relevant. On the contrary, the flow speed (812) may be influenced by marine streams.

Therefore, it is possible to define a transitional zone (i.e. between lines 800 and 822—marine transitional zone—and between lines 800 and 821—continental transitional zone) where the flow speed field will have a transition between flow speed (811) in continental zone and flow speed (812) of the sea in the marine zone.

It is noted that the transition may be different in the marine transitional zone and in the continental transitional zone.

For instance, in the continental transitional zone, the flow speed field may be deformed so that the flow speed is perpendicular to the line 800, i.e. the limit between the continental zone 801 and the marine zone 802. In other words, the gradient of the flow speed is aligned with the shore line 800.

For instance, in the marine transitional zone, the global flow speed 830 field may be modified so that the flow speed at a given position is a combination of the flow speed at said given position if it was in a continental zone (i.e. without the presence of sea) and the flow speed (812) of the sea at said position. Said combination may be weighted by the distance of said position to the line 800. The weight used for said combination may be a linear weight or any other weight to smooth the transition.

The combination of the flow speed at said given position may be a function of the distance between said position and the line 800.

The combination of the flow speed at said given position may be $S=\alpha Sc+(1-\alpha)Sm$ where Sc is a vector representing the speed flow (811) in the continental zone (i.e. above line 800), Sm is a vector representing the flow speed (812) of the sea (i.e. below line 800)), S is a vector representing the global flow speed (830) and $\alpha$ is a number between 0 and 1. $\alpha$ may be a function of the position and of the distance to the line 800. For instance, $\alpha$ may be 1 when the position is in the continental zone (i.e. above line 800) or when the position is above line 821 (i.e. in the continental zone but not in the continental transitional zone). Another option is to set the transitional zone as a void zone (i.e. line 821 and line 800 being the same line). $\alpha$ may be linear, exponential or logarithmic in the marine zone or in the marine transitional zone. For instance, in the marine transitional zone, $\alpha$ may be a sigmoid or a logistic function (S shape).

The size of the continental transitional zone and the size of the marine transitional zone is not necessarily the same.

It is also important to note that the model may be a parametric model $M_p(u,v,t)$ and thus may depend of the time. Therefore, the line 800 (separating the continental zone and the marine zone) may change between two times t1 and t2.

Therefore, it is possible to recompute the flow speed field at each increment of t (if, for instance, line 800 has changed in between said increment). Interpolation may be performed between two increments.

In addition, the flow speed 812 of the sea may be determined based on hydrodynamic modeling.

Figure 9A:
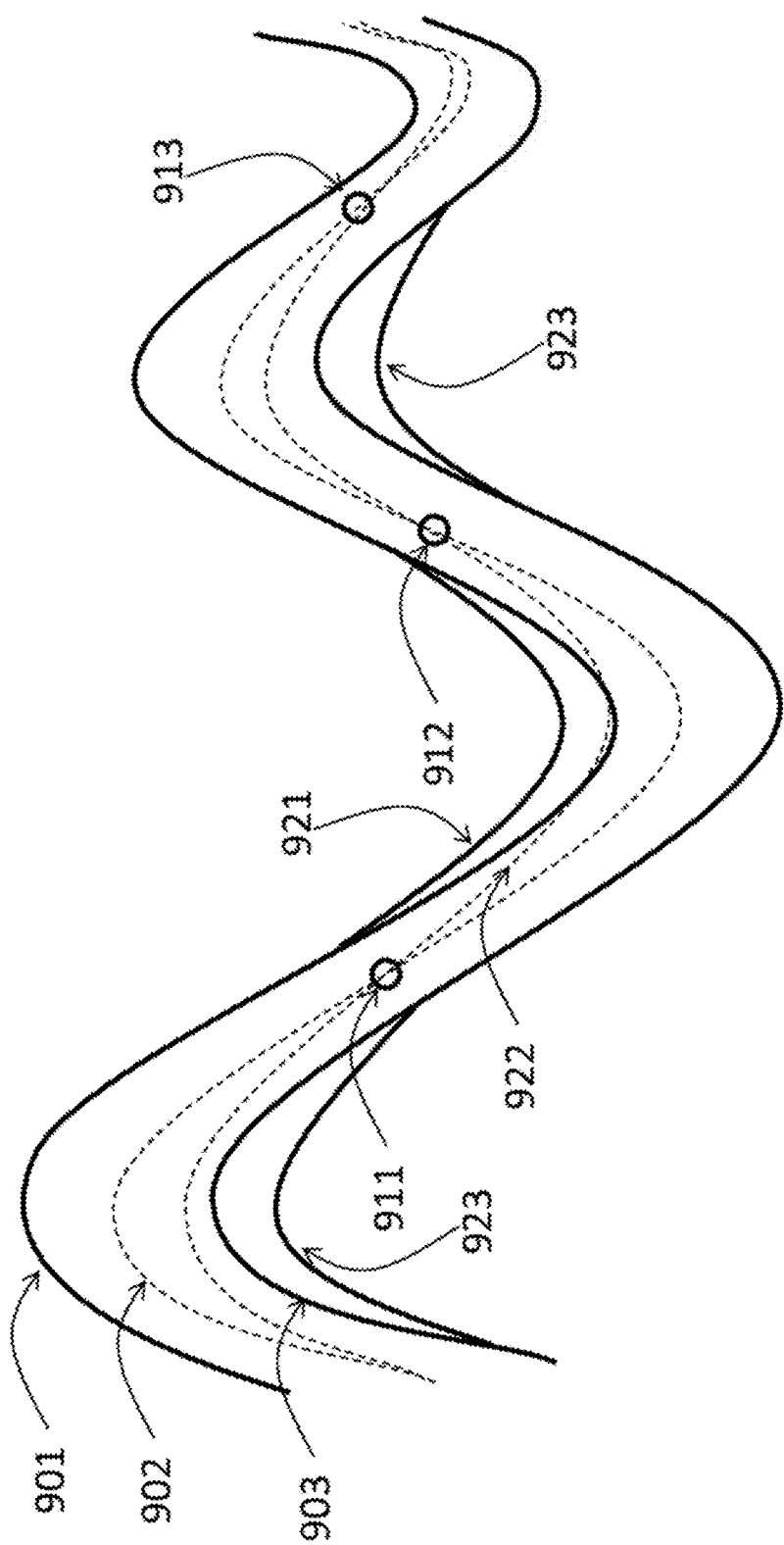
FIG. 9a is a possible embodiment for creating point bar zones such as described in FIG. 6a, 6b or 6c.

FIG. 9a is a possible embodiment for creating point bar zones such as described in FIG. 6a, 6b or 6c. A point bar is a depositional feature made of alluvium that accumulates on the inside bend of streams and rivers below the slip-off slope. Point bars are found in abundance in mature or meandering streams. They are crescent-shaped and located on the inside of a stream bend, being very similar to, though often smaller than, towheads, or river islands.

To create in the model said point bar zones, it is proposed to first create a fluvial geological formation such as described in FIG. 2a or 2b (lines 901 and 903 are the external bed of the fluvial geological formation—line 902 may be similar to trajectory 201 in FIG. 2b). It is noted that the representation of FIG. 9a is a 2D representation, but the formation and the modeling may be 3D using for instance B-splines, NURBS, etc. (i.e. parametric surfaces).

In order to define line 902, it is possible to parametrize a stochastic simulation based on seismic images where the external geological formation may be visible. As a matter of fact, line 902 may also be determined directly based on the seismic image without any stochastic simulation of the trajectory.

Once said fluvial geological formation is determined, it is possible to identify points (911, 912, 913) of lines 902 where there is an inflection (i.e. inflection points). Any methods to determine inflection points or approximation of real inflection points may be used to determine said points. In the following, the wording "inflection points" are used even if the determined points are not all the inflection points (i.e. a subset of inflection points having specific characteristics) or even if said points are only approximations of inflection points.

Once said "inflection points" are determined, it is possible to slightly deform line 902 to reduce the curvature of the line 902. Said deformation of line 902 will define a new line 922. Said line 922 also goes through inflection points.

Once said line 922 is defined, the new surface (lines 921 and 923) of a fluvial geological formation may be defined as previously described.

As described in relation with FIGS. 3b and 3c, it is possible to recompute parametric surfaces (e.g. NURBS) to subtract the previous fluvial geological formation defined by lines 901 and 903 to the current fluvial geological formation defined by lines 921 and 923.

It is apparent that it is possible to reiterate the deformation of line 902 or 922 and the subtraction of the newly defined fluvial geological formation with the former defined fluvial geological formations.

The reiteration may be limited by a predetermined number of iterations, by a percentage of deformation, by geometrical constraints of the formation or a combination of the latter.

In addition, it is possible to associate with each fluvial geological formation (that are the point bars) geological properties such as transmissivity limitation.

It is noted that said method may be used to determine point bars for a same stratigraphic layer (i.e. for a given stratigraphic time).

Figure 9B:
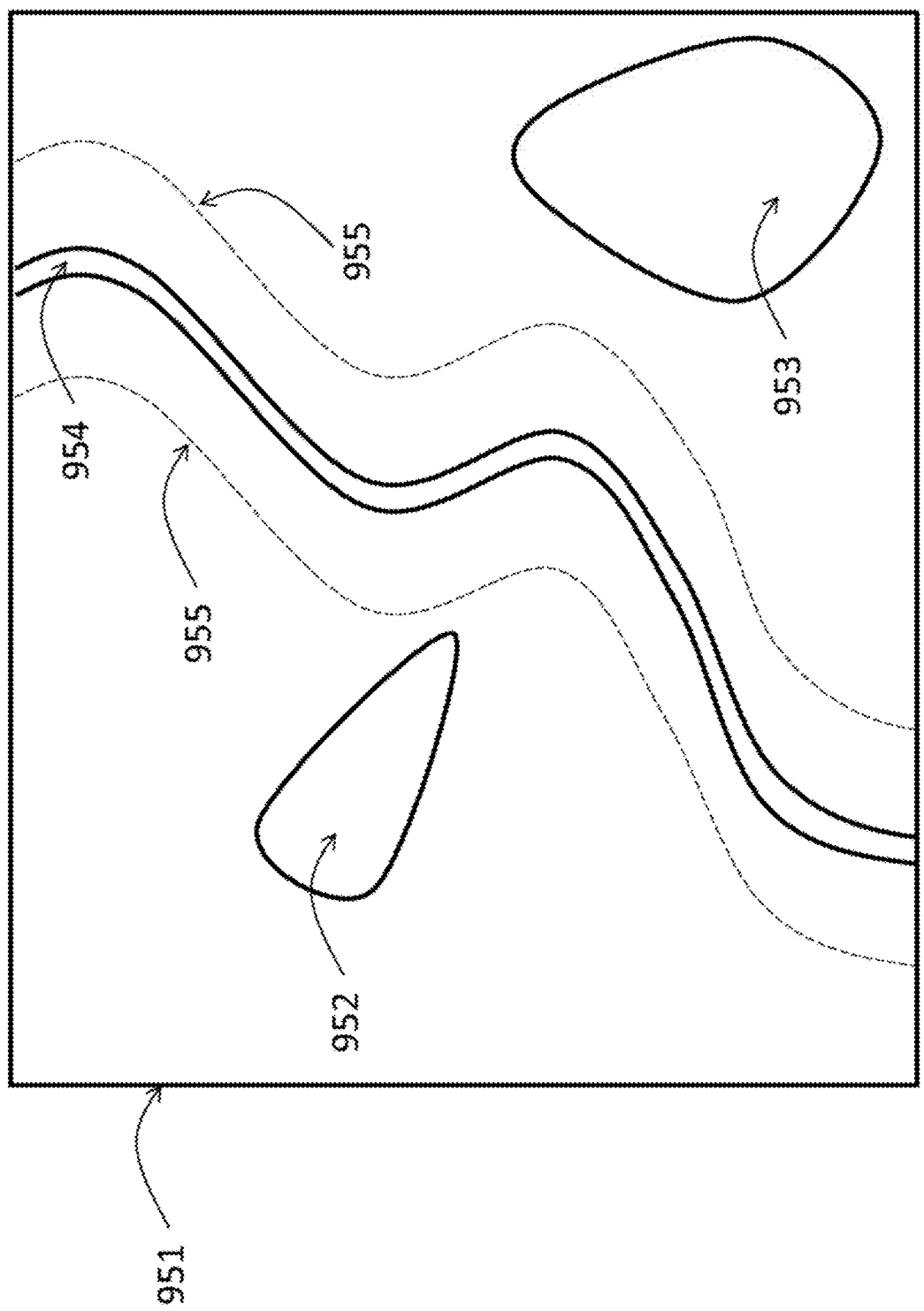
FIG. 9b is a possible embodiment for determining fluvial formations for different stratigraphic layers.

FIG. 9b is a possible embodiment for determining fluvial formations for different stratigraphic layers.

The model 951 is a 2D model for the sake of the representation but a 3D model with different stratigraphic layers is possible.

In said model 952, "no-flow" zones 952 and 953 (i.e. zones where fluvial formations cannot exists) may be defined.

As described previously, a fluvial formation 954 (with or without point bar) may be determined (e.g. manually or via a stochastic process). Once said fluvial formation 954 is determined, it is possible to define a zone (955) around said fluvial formation to add constraints for determination of future fluvial formations. The limits of the zone 955 (named constraint zone) may be at a predetermined distance of the fluvial formation 954. The distance may be any mathematical distance such as a Manhattan distance or a Euclidian distance.

Once said constraint zone is defined, it is possible to reiterate a stochastic determination of a new fluvial formation with the constraints that every point of said new fluvial formation is within said constraint zone: for instance, if a point of the new determined fluvial zone is outside said constraint zone, it is possible to reiterate the determination of said point as long as the point is not in the constraint zone (if the number of reiteration for said point exceeds a predetermined number, it is possible to reinitialize the stochastic determination of the whole fluvial formation or to keep said point even if it is not in the constraint zone). If a point of the new determined fluvial zone is outside said constraint zone, it is also possible to move said point to the nearest point of the constraint zone and thus to continue with said point for the stochastic determination. It is also possible to first try to reiterate the determination of said point as long as the point is not in the constraint zone and if the number of reiteration for said point exceeds a predetermined number, it is possible to move said point as stated above.

A plurality of new fluvial formations may be determined with the constraint zone 955. Alternatively, a new constraint zone is determined for each new fluvial formation and said new constraint zone is used for the next determination of the fluvial formation. It is also possible to use the first determined constraint zone but to add a displacement (horizontal and/or vertical) that may be a function of the stratigraphic layer (i.e. the geological time) used for the determination of a fluvial formation.

Figure 10:
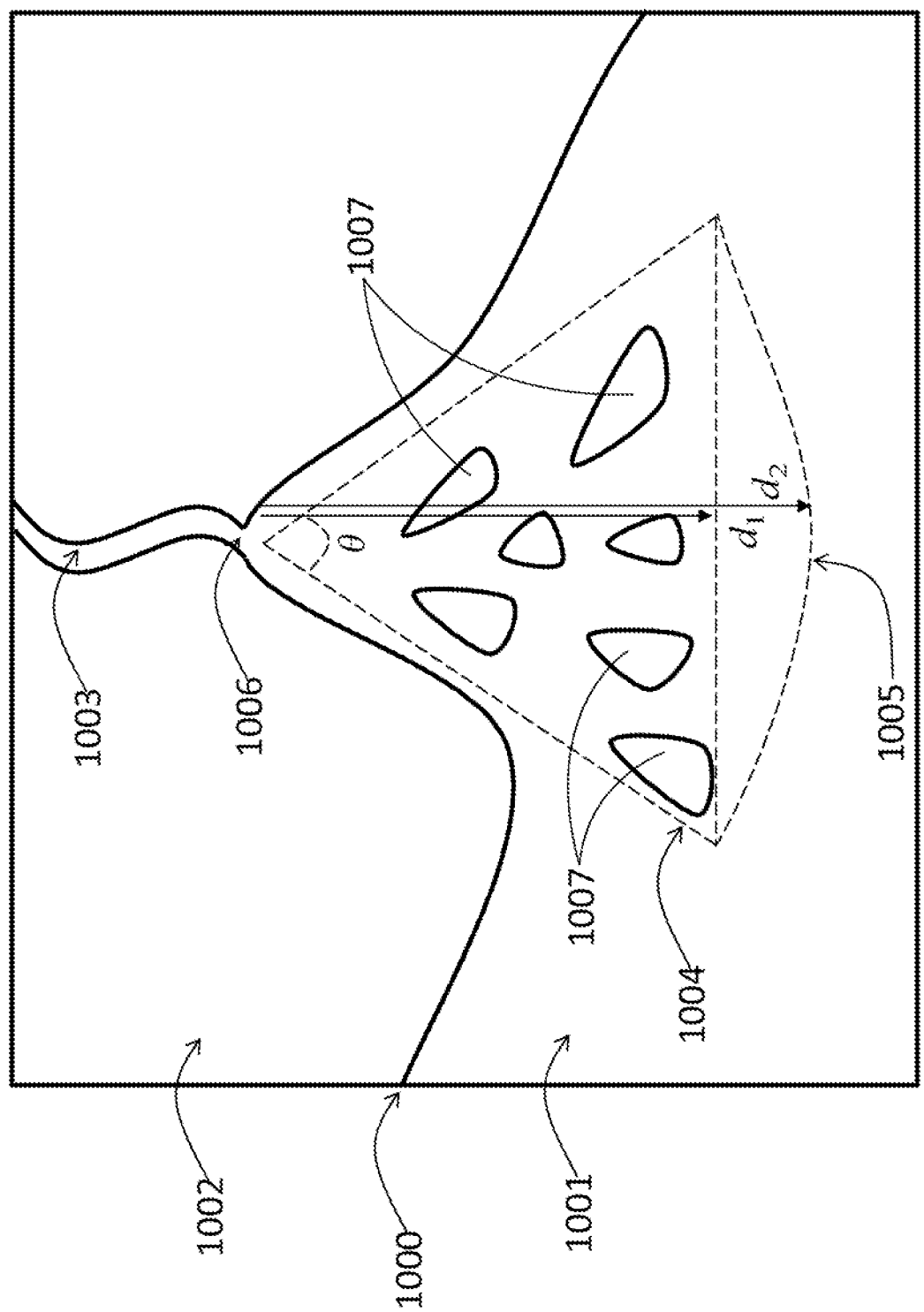
FIG. 10 is a representation of the modeling of lobes (i.e. at an end of the fluvial formation) in marine zones of the model, especially in case of tide-dominated deltas.

FIG. 10 is a representation of the modeling of bars (i.e. at an end of the fluvial formation) in marine zones of the model, especially in case of tide-dominated deltas.

The shape of a delta is influenced by sediment input, wave energy, and tidal energy. Deltas which undergo strong tidal interaction are classified as tide-dominated deltas. As sediment travels out of the delta into the sea, high tides and flood tides confine sediment on the delta plain and low tides carry sediment seaward. Tide-dominated deltas typically occur in locations of large tidal ranges or high tidal current speeds.

For instance, the model may comprise a continental zone 1002, a marine zone 1001 delimited by a shore line 1000. In said model, a fluvial formation 1003 has been determined.

When it is determined that the model comprises a tide-dominated delta (manually or via determination of the speed flow of the sea and of the continental zone and comparison with the flow speed in the fluvial formation), it is possible to define a delta zone (for instance a triangular zone, a circular sector, etc.).

The shape of the delta zone (for instance in the furthest part of the delta zone, in regard of the fluvial formation, i.e. line 1005) may be a function of the marine flow speed and the flow speed in the fluvial formation.

In addition, the delta zone may be parametrized by the delta angle $\theta$, the thickness of the deposit for the lobes, the distance $d_1$ or $d_2$ (depending of the form of the delta). For instance, if the flow speed in the fluvial formation is important, the distance may increase.

In order to determine the location of the tidal bars 1007 in the delta zone that has been defined (for each stratigraphic layer, for instance), it is possible to determine stochastic trajectories from point 1006 (i.e. the end of the fluvial formation 1003 and the beginning of the delta zone) taking into account (optionally) the fluvial flow speed and/or the marine flow speed. The determined trajectories are determined inside the delta zone 1004. The determination of the trajectory ends when a point of the trajectory is determined outside the delta zone.

During the determination of the trajectory, it is possible to stochastically determine if the new point that is being determined for the trajectory is a location for a bar. Alternatively, it is possible to determine the full trajectory and then determine points of said trajectory where a bar is located.

Therefore, it is possible to insert in the model bars 1007 at the determined locations The form and thickness of the bars may depend on the marine flow speed at the location of the bars. Therefore, a database where a correspondence between range of flow speed and forms of bars may have been predetermined.

Figure 11:
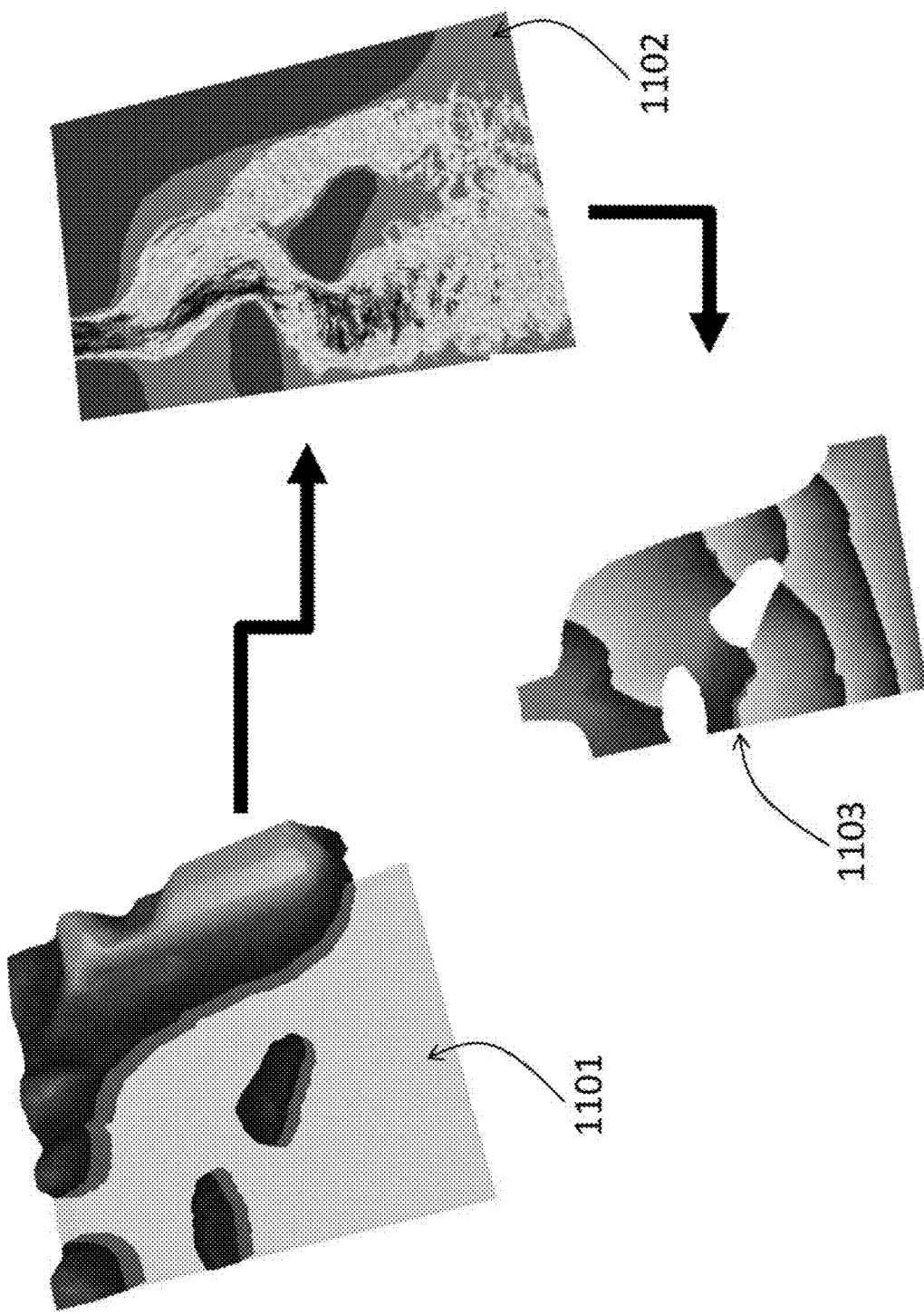
FIG. 11 is a representation of the modeling of the flow speed (or the gradient of the flow speed) in the model for a stratigraphic layer.

FIG. 11 is a representation of the modeling of the flow speed (or the gradient of the flow speed) in the model for a stratigraphic layer.

In the prior art, a plurality of methods has been developed to determine the flow speed field in the model. For instance, in a former method, objects in the model should be identified (e.g. architectural elements) and for each object a privileged direction of flow should be indicated. Nevertheless, said identification may be long, difficult and subjective.

In said proposed method, proportion cubes are used. Indeed, proportion cubes are often already available in geological modeling (determined thanks to seismic images, well data, etc.).

A facies proportion cube is a description of the reservoir model in terms of vectorial properties (each cell of the cube contains the probability of occurrence of each facies represented in the model). The cube is then a representation of the distribution of facies and may be associated with uncertainties. The cube may be a function of the position (u,v,t) in the model or a plurality of cubes may be defined, one for each defined zone of the model.

In the present method, it is first possible to define no-flow zones (i.e. the mountain-shape zones in the example of map 1101) (optional).

Based on the available proportion cubes, it is possible to determine for each location (or for a plurality of locations) of the model a respective property value, for example a permeability value (each shade of grey represents a respective pseudo-permeability value in map 1102). Indeed, as the proportion cube contains the probability of occurrence of each facies and as each facies as a given permeability, the local (pseudo) permeability may be easily determined.

If proportion cubes are not available for some points/locations of the model, it is possible to compute a local mean (with a given window/with a given distance around said points) to create information associated to pseudo-permeability to said points. It is possible to use an interpolation algorithm.

The permeability value may be set to zero for no-flow zones.

Once the permeability map is determined (map 1102), it is possible to determine the gradient of the flow speed based on said permeability map. Indeed, by solving the Darcy-Weisbach equation (with a given hydraulic load), it is possible to obtain a gradient flow speed field (element 1103, where a line with a same shade of grey represents an iso-value line of the gradient field—the trajectories could be perpendicular to said iso-value lines).

Therefore, the (for instance, stochastic) trajectory may be determined thanks to said gradient flow speed as explained before, based on the proportion cubes. Therefore, there is no need of any azimuth map.

Figure 12:
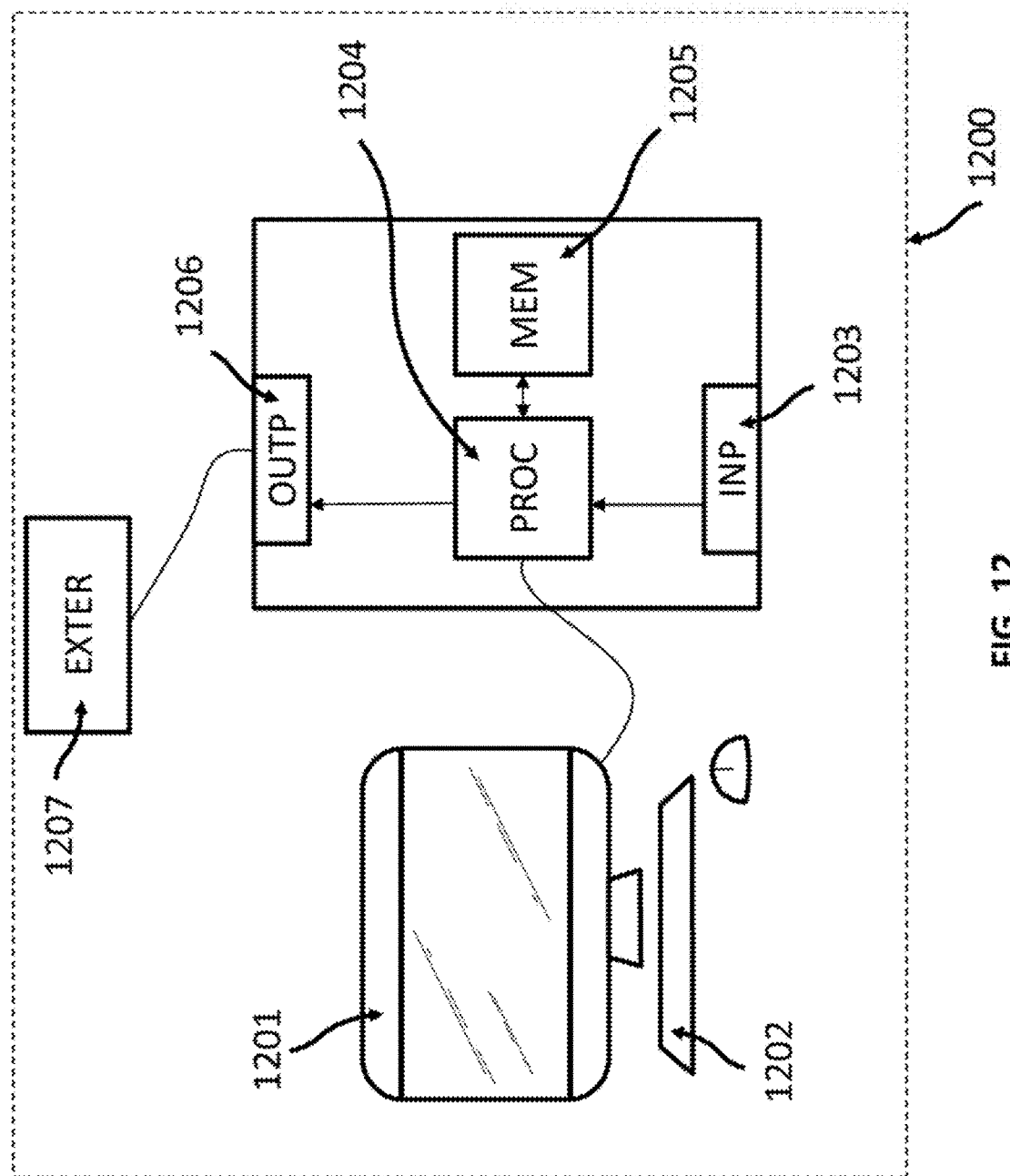
FIG. 12 is a possible embodiment for a device that enables one embodiment (at least) of the present disclosure.

FIG. 12 is a possible embodiment for a device that enables the present disclosure.

In this embodiment, the device 1200 comprises a computer, this computer comprising a memory 1205 to store program instructions loadable into a circuit and adapted to cause circuit 1204 to carry out the steps of the present disclosure when the program instructions are run by the circuit 1204.

The memory 1205 may also store data and useful information for carrying the steps of the present disclosure as described above.

The circuit 1204 may be for instance:
a processor or a processing unit adapted to interpret instructions in a computer language, the processor or the processing unit may comprise, may be associated with or be attached to a memory comprising the instructions, or the association of a processor/processing unit and a memory, the processor or the processing unit adapted to interpret instructions in a computer language, the memory comprising said instructions, or an electronic card wherein the steps of the disclosure are described within silicon, or a programmable electronic chip such as a FPGA chip (for «Field-Programmable Gate Array»).

This computer comprises an input interface 1203 for the reception of data/model/input used for the above method according to the disclosure and an output interface 1206 for providing a complete model to an external device 1207.

To ease the interaction with the computer, a screen 1201 and a keyboard 1202 may be provided and connected to the computer circuit 1204.

Expressions such as "comprise", "include", "incorporate", "contain", "is" and "have" are to be construed in a non-exclusive manner when interpreting the description and its associated claims, namely construed to allow for other items or components which are not explicitly defined also to be present. Reference to the singular is also to be construed in be a reference to the plural and vice versa.

A person skilled in the art will readily appreciate that various parameters disclosed in the description may be modified and that various embodiments disclosed may be combined without departing from the scope of the disclosure. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method for determination of a real subsoil geological formation, comprising:
   receiving a model representing the real subsoil;
   determining a first fluvial geological formation in said model using parametric surfaces;
   determining a subsequent fluvial geological formation as a deformation of the first fluvial geological formation using parametric surfaces;
   subtracting the first fluvial geological formation from the subsequent fluvial geological formation to create a point bar formation as a new real subsoil geological formation,
   wherein the determining of the subsequent fluvial geological formation and the subtracting the first fluvial geological formation from the subsequent fluvial geological formation are reiterated to create a plurality of point bar formations, and
   wherein a respective flow transmissivity parameter is associated with each one of the plurality of point bar formations, the respective flow transmissivity parameter for a given point bar formation determined during an iteration n being greater than the respective flow transmissivity parameter for a given point bar formation determined during an iteration n+1; and
   outputting a complete model to a computing device, the complete model indicating the plurality of point bar formations as real subsoil geological formations, which are usable to identify at least one hydrocarbon reservoir based on the plurality of point bar formations.

2. The method of claim 1, wherein the determining of the first fluvial geological formation is performed based on a stochastic process.

3. The method of claim 1, wherein the determining the subsequent fluvial geological formation as a deformation of the first fluvial geological formation using parametric surfaces comprises:
   determining inflection points of a trajectory of the first fluvial formation, said trajectory being in the parametric surface of the first fluvial formation;
   modifying the trajectory of the first fluvial formation to create a trajectory of the subsequent fluvial formation, said trajectory of the subsequent fluvial formation passing through the inflection points; and
   defining a parametric surface of the subsequent fluvial formation based on the trajectory of the subsequent fluvial formation.

4. A device for determination of a real subsoil geological formation, comprising:
   an interface configured to receive a model representing the real subsoil;
   a circuit configured to determine a first fluvial geological formation in said model using first parametric surfaces;
   a circuit configured to determine a subsequent fluvial geological formation as a deformation of the first fluvial geological formation using parametric surfaces;
   a circuit configured to subtract the first fluvial geological formation from the subsequent fluvial geological formation to create a point bar formation as a new real subsoil geological formation,
   wherein the determining of the subsequent fluvial geological formation and the subtracting the first fluvial geological formation from the subsequent fluvial geological formation are reiterated to create a plurality of point bar formations, and
   wherein a respective flow transmissivity parameter is associated with each one of the plurality of point bar formations, the respective flow transmissivity parameter for a given point bar formation determined during an iteration n being greater than the respective flow transmissivity parameter for a given point bar formation determined during an iteration n+1; and
   a circuit configured to output a complete model to a computing device, the complete model indicating the plurality of point bar formations as real subsoil geological formations, which are usable to identify at least one hydrocarbon reservoir based on the plurality of point bar formations.

5. A non-transitory computer readable storage medium, having stored thereon a computer program comprising program instructions, the computer program being loadable into a data-processing device and adapted to cause the data-processing device to perform a method for determination of a real subsoil geological formation when the computer program is run by the data-processing device, the method comprising:
   receiving a model representing the real subsoil;
   determining a first fluvial geological formation in said model using parametric surfaces;
   determining a subsequent fluvial geological formation as a deformation of the first fluvial geological formation using parametric surfaces;
   subtracting the first fluvial geological formation from the subsequent fluvial geological formation to create a point bar formation as a new real subsoil geological formation,
   wherein the determining of the subsequent fluvial geological formation and the subtracting the first fluvial geological formation from the subsequent fluvial geological formation are reiterated to create a plurality of point bar formations,
   wherein a respective flow transmissivity parameter is associated with each one of the plurality of point bar formations, the respective flow transmissivity parameter for a given point bar formation determined during an iteration n being greater than the respective flow transmissivity parameter for a given point bar formation determined during an iteration n+1; and
   outputting a complete model to a computing device, the complete model indicating the plurality of point bar formations as real subsoil geological formations, which are usable to identify at least one hydrocarbon reservoir based on the plurality of point bar formations.

6. The non-transitory computer readable storage medium of claim 5, wherein the determining of the first fluvial geological formation is performed based on a stochastic process.

7. The non-transitory computer readable storage medium of claim 5, wherein the determining the subsequent fluvial geological formation as a deformation of the first fluvial geological formation using parametric surfaces comprises:
   determining inflection points of a trajectory of the first fluvial formation, said trajectory being in the parametric surface of the first fluvial formation;
   modifying the trajectory of the first fluvial formation to create a trajectory of the subsequent fluvial formation, said trajectory of the subsequent fluvial formation passing through the inflection points; and
   defining a parametric surface of the subsequent fluvial formation based on the trajectory of the subsequent fluvial formation.

* * * * *